(12) United States Patent
Abbott et al.

(10) Patent No.: US 12,158,441 B2
(45) Date of Patent: Dec. 3, 2024

(54) RAIN DETECTION DEVICE, GARDEN APPLIANCE HAVING THE RAIN DETECTION DEVICE, AND METHOD FOR SENSING RAIN DROPS ON A SURFACE BY MEANS OF A RAIN DETECTION DEVICE

(71) Applicant: Robert Bosch GmbH, Stuttgart (DE)

(72) Inventors: Paul Abbott, Swaffham Prior (GB); Chris Wild, Sheffield (GB)

(73) Assignee: Robert Bosch GmbH, Stuttgart (DE)

( * ) Notice: Subject to any disclaimer, the term of this patent is extended or adjusted under 35 U.S.C. 154(b) by 119 days.

(21) Appl. No.: 17/997,284

(22) PCT Filed: Apr. 23, 2021

(86) PCT No.: PCT/EP2021/060673
§ 371 (c)(1),
(2) Date: Oct. 27, 2022

(87) PCT Pub. No.: WO2021/219507
PCT Pub. Date: Nov. 4, 2021

(65) Prior Publication Data
US 2023/0176000 A1 Jun. 8, 2023

(30) Foreign Application Priority Data
Apr. 29, 2020 (DE) ............. 10 2020 205 401.0

(51) Int. Cl.
*G01N 27/22* (2006.01)
*A01D 34/00* (2006.01)
*A01D 101/00* (2006.01)

(52) U.S. Cl.
CPC ........... *G01N 27/22* (2013.01); *A01D 34/006* (2013.01); *A01D 2101/00* (2013.01)

(58) Field of Classification Search
None
See application file for complete search history.

(56) References Cited

U.S. PATENT DOCUMENTS 6,373,263 B1 * 4/2002 Netzer ................ G01N 27/226
324/665
6,774,789 B2 8/2004 Inaba et al.
(Continued)

FOREIGN PATENT DOCUMENTS

DE 38 16 622 A1 11/1989
EP 0 333 564 A1 9/1989
(Continued)

OTHER PUBLICATIONS

International Search Report corresponding to PCT Application No. PCT/EP2021/060673, mailed Jul. 12, 2021 (German and English language document) (6 pages).

*Primary Examiner* — Farhana A Hoque
(74) *Attorney, Agent, or Firm* — Maginot, Moore & Beck LLP

(57) ABSTRACT

A rain detection device for sensing rain drops on a surface includes at least one sensor unit and at least one evaluation unit. The sensor unit includes at least one capacitive sensor element. The sensor element is configured such that a capacitance characteristic of the sensor element changes based on an object contacting the surface. The evaluation unit is configured to detect rain drops on the surface based on a differential signal of the sensor element. The evaluation unit is configured to detect a rain drop on the surface based on a symmetry characteristic of the differential signal with respect to a zero point.

12 Claims, 7 Drawing Sheets

(56) References Cited

U.S. PATENT DOCUMENTS

2013/0019618 A1* 1/2013 Veerasamy ............ B60S 1/087
62/85
2017/0277301 A1 9/2017 Koresawa et al.

FOREIGN PATENT DOCUMENTS

| EP | 0 753 438 A1 | 1/1997 |
| EP | 1 686 026 A1 | 8/2006 |
| EP | 2 100 722 A2 | 9/2009 |
| WO | 2017/214657 A1 | 12/2017 |
| WO | 2020/020652 A1 | 1/2020 |

* cited by examiner

RAIN DETECTION DEVICE, GARDEN APPLIANCE HAVING THE RAIN DETECTION DEVICE, AND METHOD FOR SENSING RAIN DROPS ON A SURFACE BY MEANS OF A RAIN DETECTION DEVICE

Rain detection device, garden appliance having the rain detection device, and method for sensing rain drops on a surface by means of a rain detection device This application is a 35 U.S.C. § 371 National Stage Application of PCT/EP2021/060673, filed on Apr. 23, 2021, which claims the benefit of priority to Serial No. DE 10 2020 205 401.0, filed on Apr. 29, 2020 in Germany, the disclosures of which are incorporated herein by reference in their entirety.

BACKGROUND

A rain detection device for sensing rain drops on a surface has previously been proposed, having at least one sensor unit comprising at least one capacitive sensor element, the sensor element being designed and/or arranged in such a way that a capacitance characteristic value of the sensor element changes depending on an object contacting the surface, and having at least one evaluation unit which is configured to detect rain drops on the surface depending on a differential signal from the sensor element.

SUMMARY

The disclosure is based on a rain detection device for sensing rain drops on a surface, having at least one sensor unit comprising at least one capacitive sensor element, the sensor element being designed and/or arranged in such a way that a capacitance characteristic value of the sensor element changes depending on an object contacting the surface, and having at least one evaluation unit which is configured to detect rain drops on the surface depending on a differential signal from the sensor element.

It is proposed that the evaluation unit is configured to detect a rain drop on the surface depending on a symmetry characteristic value of the differential signal, in particular with respect to a zero point. The term "configured" is intended to mean, in particular, specially programmed, specially designed and/or specially equipped. The fact that an object, in particular the evaluation unit, is configured for a specific function, in particular to detect rain drops on the surface, is intended to mean in particular that the object fulfills and/or executes this particular function in at least one application state and/or operating state. Preferably, the evaluation unit is designed as an electronic unit, in particular as an electronic circuit board populated with components. Preferably, the evaluation unit comprises at least one microcontroller for evaluating signals acquired via the sensor unit, in particular the sensor element. The evaluation unit, in particular the microcontroller, is preferably electrically and/or electronically connected to the sensor unit, in particular the sensor element. Preferably, the evaluation unit, in particular the microcontroller, is designed to detect rain drops on the surface by reading out the signals acquired via the sensor unit, in particular the sensor element, in particular the capacitance characteristic value and/or the differential signal, at least substantially continuously and in particular by evaluating them. Alternatively or in addition, it is conceivable that the evaluation unit, in particular for detecting rain drops and/or for executing the algorithm, may comprise at least one processor and/or an FPGA. The evaluation unit, in particular the microcontroller, is particularly preferably configured to generate the differential signal of the sensor element depending on the capacitance characteristic value, in particular transmitted from the sensor element to the evaluation unit. The evaluation unit is preferably configured to subtract, in particular continuously, at least one value of the capacitance characteristic value from another previously acquired value of the capacitance characteristic value in order to generate the differential signal, in particular to calculate a value of the differential signal, wherein in particular a value of the differential signal is determined. It is conceivable that the evaluation unit is configured to generate, determine and/or calculate the differential signal, in particular the values of the differential signal, either by circuit technology or electronically, in particular by means of the microcontroller. It is also conceivable that the sensor unit is intended to generate the differential signal and transmit it to the evaluation unit. The term "intended" is to be understood, in particular, to mean specially designed and/or equipped. The fact that an object, in particular the sensor element, is intended for a specific function, in particular to generate the differential signal and/or transmit the differential signal to the evaluation unit, is intended to mean in particular that the object fulfills and/or executes this particular function in at least one application state and/or operating state. For example, the sensor element is intended to generate the differential signal by means of circuit technology depending on the capacitance characteristic value. A "symmetry characteristic value" is intended in particular to mean a characteristic parameter of a signal, in particular the differential signal, which describes a symmetry of a signal shape and/or of separate value sets of the signal across a waveform, in particular with regard to a zero point of the signal. In particular, the differential signal is formed as a temporal waveform of a rate of change of the capacitance characteristic value of the sensor element. A "capacitance characteristic value" is intended in particular to mean a characteristic parameter that describes, influences and/or indicates an electrical capacitance, in particular as a physical variable, of a system and/or a component, in particular the sensor element. In particular, the sensor unit, in particular the sensor element, is designed in such a way that if water is present on the surface, in particular due to rain drops, a value of the capacitance characteristic value increases in relation to a surface surrounded by air.

A "capacitive sensor element" is intended to mean in particular a sensor element which operates on the basis of a change in the electrical capacitance of a single capacitor, a component similar to or acting as a capacitor, or a capacitor system. Preferably, the capacitive sensor element is formed by at least one electrode pair. In particular, the capacitance characteristic value is formed by the electrical capacitance between the electrode pair. In particular, the rain detection device comprises exactly one capacitive sensor element, which forms in particular at least one electrode pair, preferably exactly one. Preferably, the surface is spaced apart from the electrode pair of the sensor element. In particular, the surface is formed as an external surface of the sensor unit, in particular an insulating element of the sensor unit, and/or arranged within close range of the sensor element, in particular the electrode pair. A "close range" of an object, in particular the sensor element and/or the electrode pair, is intended to mean an area which extends around the object at a maximum distance of 3 cm, preferably a maximum of 2 cm, and most preferably a maximum of 1 cm. Preferably, the electrode pair of the sensor element is electrically insulated from the surface, in particular by means of the insulating element. For example, the insulating element is designed as an isolating layer made of an at least substantially electrically insulating material. It is conceivable that the sensor element, in particular the electrode pair, and the insulating element are designed in one piece, the sensor element being arranged, for example, at least for the most part inside or on the insulating element. The term "in one piece" is intended in particular to describe a materially bonded connection, such as by means of a welding process and/or an adhesive process, and particularly advantageously molded on, such as produced in a single- or multi-component injection molding process. The insulating element is designed in particular to be watertight. Preferably, the insulating element is designed to surround the sensor element in a watertight manner or to cover it in a watertight manner on at least one side, in particular in a direction oriented from the surface to the sensor element.

Preferably, the two electrodes of the electrode pair are designed to be spaced apart from each other. The minimum distance between the two electrodes is preferably not more than 1.5 mm, preferably not more than 1.2 mm and most preferably not more than 1 mm. In particular, the minimum distance between the two electrodes is at least 0.2 mm, preferably at least 0.4 mm and most preferably at least 0.5 mm. Preferably, the sensor element, in particular the two electrodes, has a maximum thickness of 3 mm, preferably a maximum thickness of 2.5 mm and most preferably a maximum thickness of 2 mm. In particular, the two electrodes extend in a main extension plane of the sensor element, which is oriented at least substantially parallel to the surface. A "main extension plane" of a component, in particular the sensor element, is intended to mean a plane that is parallel to a largest lateral surface of a smallest imaginary block which just completely surrounds the component, and in particular passes through the center of the block. The term "substantially parallel" is intended to mean in particular an orientation of a straight line, a plane or a direction, in particular the main extension plane of the sensor element, relative to another straight line, another plane or a reference direction, in particular a plane through the surface, wherein the straight line, the plane or the direction, in particular when viewed in a projection plane, has a deviation of in particular less than 8°, advantageously less than 5°, and particularly advantageously less than 2° relative to the other straight line, the other plane or the reference direction. Preferably, the surface is designed as a flat, level surface. It is also conceivable, however, that the surface and/or the sensor element, in particular the two electrodes, may be bent, wherein in particular the surface and the sensor element, in particular the two electrodes, have an at least essentially identical basic shape, in particular bend. The maximum thickness of the sensor element, in particular of the two electrodes, is preferably oriented at least substantially perpendicular to the main extension plane of the sensor element. The term "substantially perpendicular" is intended to mean in particular an orientation of a straight line, a plane or a direction, in particular a straight line along the maximum thickness of the sensor element, relative to another straight line, another plane or a reference direction, in particular the main extension plane of the sensor element, wherein the straight line, the plane or the direction and the other straight line, the other plane or the reference direction, in particular when viewed in a projection plane, enclose an angle of 90° and the angle has a maximum deviation of in particular less than 8°, advantageously less than 5°, and particularly advantageously less than 2°. The sensor element, in particular the two electrodes, is preferably at least substantially plate-shaped. "Substantially plate-shaped" is intended to mean in particular a component, in particular the sensor element, which has a material thickness at least substantially perpendicular to its main extension plane that is at least substantially constant, and which is equal to less than 50%, preferably less than 25% and particularly preferably less than 10% of a surface extent, in particular a minimum surface extent, of the component which is oriented at least substantially parallel to the main extension plane of the component. However, it is also conceivable that the sensor element, in particular the two electrodes, may have a circular-segment-shaped and/or curved basic shape in at least one cutting plane, oriented in particular at least substantially perpendicular to the main extension plane of the sensor element.

The minimum distance between the surface and the two electrodes is preferably not more than 0.8 mm, preferably not more than 0.5 mm and most preferably not more than 0.38 mm. In particular, the minimum distance between the surface and the two electrodes corresponds to a thickness of the insulating element which is arranged in particular between the two electrodes and the surface. In particular, the minimum distance between the surface and the two electrodes is at least 0.05 mm, preferably at least 0.15 mm and most preferably at least 0.3 mm. The minimum distance between the surface and the two electrodes over a region that extends between the surface and the two electrodes is preferably at least substantially constant. The term "substantially constant" is intended to mean in particular that a value of a characteristic parameter, in particular the minimum distance between the surface and the two electrodes, over a region and/or an extent, in particular over the region that extends between the surface and the two electrodes, has a deviation of not more than 10%, preferably not more than 5% and most preferably not more than 3%, for a mean value of the characteristic parameter measured over the region and/or extent. Preferably, the sensor unit is designed in such a way that an object, in particular a rain drop, which is moving or arranged within close range of the surface and/or touches the surface, influences and/or changes a value of the capacitance characteristic value of the sensor element, in particular of the electrode pair. Preferably, the minimum distance between the surface and the two electrodes and/or the two electrodes is formed in such a way that in an initial state of the sensor element, in particular in the absence of a solid object and/or rain drops on the surface and/or with only air within close range of the surface, a value of the capacitance characteristic value of the sensor element, in particular of the electrode pair, changes by at least 2%, preferably at least 3% and most preferably at least 5% when a rain drop is present on the surface, wherein in particular, the rain drop has a volume of water not exceeding 0.4 $cm^3$.

The rain detection device is preferably intended for use with a garden appliance, in particular a lawnmower. In particular, the rain detection device, in particular the evaluation unit, is designed to detect rain drops incident on the surface. Preferably, the rain detection device is designed as part of the garden appliance, the sensor element being arranged in particular on an external surface of the garden appliance located on an upper side of the garden appliance, in particular a housing of the garden appliance. The gardening appliance is particularly preferably designed as a semi-autonomous garden appliance, in particular as a semi-autonomous lawnmower, wherein the evaluation unit is designed in particular as part of a control and/or regulation unit of the semi-autonomous garden appliance. A "control and/or regulation unit" is intended to mean in particular a unit with at least one set of control electronics. A "control electronics" is intended to mean in particular a unit having a processor unit and a memory unit, as well as having an operating program stored in the memory unit. Preferably, the semi-autonomous garden appliance, in particular the control and/or regulation unit, is intended and/or configured to control and/or regulate at least one activity, in particular a mowing process or a locomotion, depending on an output signal from the rain detection device.

The design according to the disclosure of the rain detection device can allow an advantageously accurate detection of rain drops and/or a rain condition, in particular in order to control and/or regulate an activity such as a mowing process depending on this detection. It is possible to make an advantageously simple and accurate discrimination between rain drops and other objects influencing the sensor element, such as branches, blades of grass, a hand or a finger, etc., by means of the evaluation unit. It is possible to enable an advantageously simple and cost-effective design of the sensor element for detecting rain drops, in particular since the detection of rain drops and/or discrimination between rain drops and other objects can be carried out at least for the most part by means of the evaluation unit. It is possible to perform an advantageously reliable detection of rain drops or a rain condition by means of a capacitive measurement, while optical sensors in particular mean high costs with regard to necessary components and an arrangement of devices, and resistance measurements require exposed contacts which are susceptible to damage and contamination with dirt. In particular by evaluating the differential signal, it is advantageously possible to detect rain drops and/or the rain condition on the surface independently of changes in temperature, humidity, dust concentration in ambient air, etc.

It is also proposed that the symmetry characteristic value is formed as a ratio of a positive weighting characteristic value of the differential signal and a negative weighting characteristic value of the differential signal, the evaluation unit being configured to detect a rain drop on the surface depending on a limit value or a limit range of the symmetry characteristic value being exceeded. An advantageously simple and cost-effective design of the evaluation unit can be achieved. An advantageously rapid detection of rain drops can also be achieved. It is possible to perform an advantageously simple and accurate discrimination between rain drops and other objects influencing the sensor element, such as branches, blades of grass, a hand or a finger, etc. A layer of liquid applied on the sensor element by a rain drop, in particular on a surface of the sensor element, can be detected, which can be used to detect rain drops and/or to discriminate between rain drops and other objects. A "weighting characteristic value" of a signal, in particular the differential signal, is intended to mean a characteristic parameter that describes and/or specifies a temporal waveform of the signal based on a specific weighting relative to a reference point, in particular a zero point. Preferably, the positive weighting characteristic value is formed as an, in particular absolute, maximum of the differential signal within an evaluated time interval, as a positive component of an integral of the differential signal over the evaluated time interval, or as a sum of local maxima within the evaluated time interval. Preferably, the negative weighting characteristic value is formed as an, in particular absolute, minimum of the differential signal within the evaluated time interval, as a negative component of an integral of the differential signal over the evaluated time interval, or as a sum of local minima within the evaluated time interval. Preferably, the evaluation unit comprises at least one algorithm for detecting rain drops on the surface and/or for detecting a rain condition on the surface by means of signals acquired via the sensor element. In particular, the rain condition describes whether it is raining or not according to a specified limit for a number of rain drops detected by the evaluation unit within a specified period of time. Preferably, the evaluation unit, in particular the algorithm, is configured to detect rain drops on the surface by comparing the ratio of the positive weighting characteristic value of the differential signal and the negative weighting characteristic value of the differential signal with the at least one limit value or the limit range of the symmetry characteristic value. In particular, the limit value or the limit range of the symmetry characteristic value is stored in the evaluation unit. It is conceivable that the limit value or the limit range of the symmetry characteristic value can be specified during production or maintenance of the rain detection device and/or adapted dynamically by means of the evaluation unit, in particular the algorithm, for example by means of a machine learning procedure. It is also possible that the limit value or the limit range of the symmetry characteristic value can be adjusted by a user via an operator interface of the rain detection device or the garden appliance. In a preferred embodiment, the limit value of the symmetry characteristic value formed as a ratio of the positive weighting characteristic value and the negative weighting characteristic value is at least 2, preferably at least 3 and preferably at least 4, wherein in particular the evaluated time interval is at least 2 s, preferably at least 3 s, and preferably at least 4 s and/or not more than 10 s, preferably not more than 8 s, and most preferably not more than 5 s. Alternatively or in addition, the evaluation unit is designed to detect a rain condition on detecting at least 2, preferably at least 3 and most preferably at least 4 rain drops on the surface within a time interval of at least 2 s, preferably at least 3 s and most preferably at least 4 seconds and/or not more than 10 seconds, preferably not more than 8 seconds and most preferably not more than 5 seconds.

It is also proposed that the evaluation unit be configured to evaluate the differential signal piecewise at time intervals, in particular continuously, and to output exactly one Boolean value of a rain condition on the surface for each time interval evaluated. The rain detection device can be advantageously provided with a simple readout facility, for example by a user and/or an electronic readout of a device-external unit. This enables an advantageously simple and cost-effective readout electronics. A user-friendly operation of the rain detection device can be advantageously achieved, in particular since the user only has to distinguish between two possible outputs in order to read the rain detection device. A "Boolean value" is intended to mean one value from a set of values that comprises exactly two different values. In particular, one Boolean value of the rain condition indicates a rain condition on the surface. Preferably, another Boolean value of the rain condition indicates an absence of the rain condition on the surface. The time intervals are preferably at least 2 seconds, preferably at least 3 seconds and most preferably at least 4 seconds and/or no more than 10 seconds, preferably no more than 8 seconds and most preferably no more than 5 seconds. The time intervals are arranged consecutively, with the evaluation unit in particular being configured to divide the continuous differential signal into the time intervals. Alternatively, it is also conceivable that the evaluation unit is intended to evaluate the differential signal at periodic intervals over a time interval. Preferably, the evaluation unit is configured to determine a number of detected and/or identified rain drops for each evaluated time interval. In particular, the evaluation unit is designed to detect the rain condition on the surface when a limit of the number of rain drops detected and/or identified within the time interval is exceeded. The evaluation unit is preferably configured to output an output signal comprising the Boolean value of the rain condition when the rain condition is detected on the surface.

It is also proposed that the evaluation unit be configured to output at least one output signal, in particular a Boolean value of a rain condition on the surface, depending on the detection of rain drops on the surface, the evaluation unit being configured to temporally limit an output of the output signal and/or a change in the output signal. Malfunctions of the rain detection device and/or a device that is controlled by an output signal of the rain detection device, for example, by outputting values of the rain condition too often, can be advantageously prevented. The rain detection device can be advantageously provided with a simple readout facility, for example by a user and/or an electronic readout of a device-external unit. This enables an advantageously simple and cost-effective readout electronics. The evaluation unit is preferably configured to limit a number of output values, in particular the Boolean values, of the rain condition and/or temporally limit the number of output operations of the rain condition. The evaluation unit is preferably configured to store an output value, in particular a Boolean value, of the rain condition at least over a time interval, and to output a further rain condition value only after this time interval has elapsed, the time interval being at least 2 s, preferably at least 3 s, and preferably at least 4 s and/or not more than 1 minute, preferably not more than 30 s and most preferably not more than 10 s. Preferably, the output signal comprises at least the Boolean value determined by the evaluation unit. In particular, the control unit is configured to output the output signal to an external unit, such as the control and/or regulation unit or another component of the garden appliance, a Smart Home system or another external unit that the person skilled in the art may consider appropriate. It is conceivable that the rain detection device and/or the garden appliance may comprise at least one communication unit intended to transmit the output signal to the external unit. For example, the communication unit is designed as a radio, a W-LAN or a Bluetooth interface or another communication interface known to a person skilled in the art.

Furthermore, it is proposed that the capacitive sensor element forms at least one, in particular exactly one, electrode pair which is at least electrically connected to the evaluation unit, wherein the electrode pair covers a maximum sensing area which is at least 12 cm$^2$, preferably at least 16 cm$^2$ and preferably at least 20 cm$^2$. An advantageously large surface for detecting rain drops can be provided, which is in particular large enough to detect a layer of liquid left by a rain drop on the surface. It is possible to design the rain detection device with only one sensor element. This allows an advantageous cost-effective design to be achieved, in particular with regard to an advantageously small number of components and/or a design of the evaluation unit via which only one sensor element, in particular signals of a sensor element, can be read out. In particular, the maximum sensing area of the sensor element, in particular the electrode pair, is not more than 100 cm$^2$, preferably not more than 50 cm$^2$ and preferably not more than 30 cm$^2$. Preferably, the surface of the sensor unit, in particular the insulating element, corresponds at least to the maximum sensing area of the sensor element, in particular the electrode pair. Preferably, the maximum sensing area of the sensor element, in particular the electrode pair, is arranged at least substantially parallel to the surface. The maximum sensing area of the sensor element, in particular the electrode pair, is preferably formed as a surface that just completely surrounds the electrode pair. In particular, a minimum distance between the two electrodes of the electrode pair is arranged within the maximum sensing area of the sensor element, in particular the electrode pair. Preferably, the electrode pair and/or the maximum sensing area of the sensor element, in particular the electrode pair, are arranged in such a way that a minimum distance between the two electrodes is at least substantially constant over the maximum sensing area of the sensor element, in particular the electrode pair. Preferably, in the initial state of the sensor element, in particular in the absence of a solid object and/or rain drops on the surface and/or with only air within close range of the surface, the sensor element, in particular the electrode pair, has a capacitance characteristic value of at least 5 pF, preferably at least 10 pF and most preferably at least 12 pF. Preferably, the capacitance characteristic value in the initial state corresponds to a value of at least essentially 12.8 pF. In particular, the capacitance characteristic value in the initial state is not more than 50 pF, preferably not more than 30 pF, and preferably not more than 20 pF.

It is also proposed that the sensor unit is designed at least partially as an in particular at least substantially non-rigid, flexible membrane, which is at least electrically connected to the evaluation unit. It is possible to achieve a high degree of flexibility regarding the mounting and/or deployment area of the sensor element on an appliance. An advantageously robust design of the sensor element can be achieved. An advantageously high degree of modularity of the sensor module can be achieved with a plurality of different types of appliance. This enables advantageously low production costs to be achieved, in particular since only one design of the sensor element can be produced. The term "essentially non-rigid" is intended to refer in particular to a component, in particular the sensor unit, which has an elastic modulus of at least 200 GPa, preferably at least 300 GPa and preferably at least 400 GPa. In particular, the insulating element is made of an in particular at least substantially non-rigid, flexible material, such as a plastic, rubber, etc., wherein in particular the electrode pair is in contact with one side of the insulating element and/or arranged at least for the most part, in particular at least substantially, completely within the insulating element, e.g. cast and/or embedded in it. The sensor element is preferably designed in such a way that a change in a minimum distance between the electrodes of the electrode pair under a deformation, in particular a bending, of the sensor element and/or the insulating element is at least substantially prevented. In a preferred design, the electrode pair is applied to a flexible insulating element by means of screen printing, wherein in particular the electrode pair is arranged between the insulating element and another flexible insulating element of the sensor unit. In particular, to form a connection with the evaluation unit, the electrode pair with the exception of two electrical contacts of the electrode pair is at least substantially completely enclosed by the insulating element and the further insulating element.

In addition, a garden appliance, in particular a lawnmower, having at least one rain detection device according to the disclosure is proposed.

The design according to the disclosure of the garden appliance can allow an advantageously accurate detection of rain drops and/or a rain condition, in particular in order to control and/or regulate the garden appliance depending on the weather conditions. It is possible to make an advantageously simple and accurate discrimination between rain drops and other objects influencing the sensor element, such as branches, blades of grass, a hand or a finger, etc., by means of the evaluation unit. This allows a high degree of flexibility of the garden appliance, in particular with regard to an application environment, for example in long grass or the like. It is possible to enable an advantageously simple and cost-effective design of the garden appliance, in particular of the sensor element of the rain detection device for detecting rain drops, in particular since the detection of rain drops and/or discrimination between rain drops and other objects can be carried out at least for the most part by means of the evaluation unit.

In addition, the disclosure is based on a method for sensing rain drops on a surface by means of a rain detection device, in particular a rain detection device according to the disclosure, wherein in at least one method step a capacitive sensor element of the rain detection device is used to sense a capacitance characteristic value, wherein in at least one method step, rain drops are detected on the surface depending on a differential signal of the sensor element by means of an evaluation unit of the rain detection device.

It is proposed that in at least one method step, rain drops on the surface are detected by means of the evaluation unit depending on a symmetry characteristic value of the differential signal, in particular with respect to a zero point. Preferably, in at least one method step the differential signal is evaluated piecewise at time intervals by means of the evaluation unit, in particular continuously, wherein exactly one Boolean value of a rain condition on the surface is output for each time interval evaluated.

The embodiment of the method according to the disclosure can allow an advantageously accurate detection of rain drops and/or a rain condition, in particular in order to control and/or regulate an activity such as a mowing process depending on this detection. It is possible to perform an advantageously simple and accurate discrimination between rain drops and other objects influencing the sensor element, such as branches, blades of grass, a hand or a finger, etc. It is possible to enable an advantageously simple and cost-effective design of the sensor element for detecting rain drops, in particular since the detection of rain drops and/or a discrimination between rain drops and other objects can be carried out at least for the most part by means of the evaluation unit.

It is also proposed that in at least one method step, the continuous differential signal is evaluated by means of the evaluation unit for detecting rain drops on the surface depending on at least one weighting characteristic value of the differential signal over a predefined or a dynamic time interval. It is possible to adjust the rain detection device to suit the specific user and/or the environment. In particular, an advantageously user-specific and/or customizable detection of rain drops can also be achieved. In particular, a dynamic determination of the time interval allows an advantageously automatic adjustment of the evaluation unit to suit an environment and/or weather conditions. It is conceivable that the time interval can be dynamically adapted by means of the evaluation unit, in particular the algorithm, depending on the number of local maxima and/or minima of the differential signal determined by the evaluation unit in the time interval, on an integral of the differential signal determined by the evaluation unit over the time interval, etc.

It is also proposed that in at least one method step, in particular before an evaluation to detect rain drops on the surface, the differential signal is filtered for interference signals by means of the evaluation unit. Interference signals in the signals from the sensor element transmitted to the evaluation unit can be advantageously prevented and/or reduced. High-frequency noise in the differential signal of the sensor element can be advantageously prevented and/or reduced. This allows an advantageously accurate and fast detection of rain drops and/or the rain condition by means of the evaluation unit. Preferably, the evaluation unit is configured to filter the values of the capacitance characteristic value transmitted by the sensor element or the differential signal, in such a way that values below a filter limit of the capacitance characteristic value or of the differential signal are removed and/or not taken into account for the purposes of an evaluation and/or the recognition of rain drops on the surface. It is also conceivable that by means of the evaluation unit, in particular the algorithm, the values of the capacitance characteristic value transmitted by the sensor element, or the differential signal is/are filtered according to at least one predefined signal pattern which is stored in particular in the evaluation unit. In particular, at least one signal pattern is assigned to each interfering signal to be filtered. It is also conceivable that the evaluation unit may comprise a high-pass and/or a low-pass filter which is/are intended to filter parts of the differential signal, which in particular comprise an interference signal, in particular before the evaluation by means of the evaluation unit for detecting rain drops on the surface from the differential signal. Preferably, values of the capacitance characteristic value and/or the differential signal below a limit value of at least 3 fF, preferably at least 6 fF and most preferably at least 10 fF, are filtered and/or removed from a data stream by means of the evaluation unit.

It is additionally proposed that in at least one method step, by means of a control and/or regulation unit of the rain detection device or the garden appliance, at least one evaluation parameter of the evaluation unit is adjusted depending on a sensitivity characteristic value automatically determined and/or predefined, in particular via the evaluation unit. A high degree of user-friendliness can be ensured, in particular since the sensitivity of the detection of rain drops and/or the rain condition can be advantageously adjusted quickly and easily by the user. It is possible to use the rain detection device in an advantageously individual way. An advantageously high degree of flexibility of the rain detection device with regard to an environment, weather conditions and/or seasons can be achieved, wherein the at least one evaluation parameter can be adjusted without maintenance or disassembly of the rain detection device or without the need for a person skilled in the art. In particular, the control and/or regulation unit comprises a plurality of different values of the sensitivity characteristic value. Preferably, for the evaluation parameter, in particular all evaluation parameters, the evaluation unit comprises at least one value in each case, which is assigned to a value of the sensitivity characteristic value. When a value of the sensitivity characteristic value is selected by a user and/or the control and/or regulation unit, the evaluation parameter(s) is/are set to the value(s) assigned to the values of the sensitivity characteristic value. For example, the evaluation parameter is defined as a length of the time interval or time intervals, as a limit value or limit range of the symmetry characteristic value, as a filter cutoff value of the capacitance characteristic value or of the differential signal, etc. Alternatively or in addition, in at least one method step the sensitivity characteristic value is set using the operator interface of the rain detection device or the garden appliance, wherein in particular the at least one evaluation parameter is changed by means of the evaluation unit to a value assigned to the sensitivity characteristic value that is set. It is also conceivable that by setting the sensitivity characteristic value, the recognition of rain drops and/or the rain condition can be at least temporarily suspended, in which case in particular no output signal is output. In particular, it is conceivable that an adjustment of the evaluation parameter can be used to adjust the detection of rain drops depending on the size of the rain drops, the frequency of impacts of the rain drops on the surface, and/or the density of the rain drops. In an example configuration, each sensitivity characteristic value is assigned a value of a limit of the symmetry characteristic value and a value of a limit of the number of detected rain drops within an evaluated time interval.

In particular, the values of the limit of the symmetry characteristic value and the limit of the number of detected rain drops within the evaluated time interval are adjusted by means of the evaluation unit if the associated sensitivity characteristic value is set, in particular by a user or an external unit.

The rain detection device according to the disclosure, the garden appliance according to the disclosure and/or the method according to the disclosure shall not be restricted to the application and embodiment described above. In particular, in order to fulfil a function described herein the rain detection device according to the disclosure, the garden appliance according to the disclosure and/or the method according to the disclosure may have a number of individual elements, components and units as well as method steps that differs from a number specified herein. In addition, with regard to the ranges of values specified in this disclosure, values within the aforementioned limits should also be regarded as disclosed and as usable as desired.

BRIEF DESCRIPTION OF THE DRAWINGS

Further advantages are obtained from the following description of the drawings. The drawings illustrate an exemplary embodiment of the disclosure. The drawings, the description and the claims contain numerous features in combination. The person skilled in the art will also advantageously consider the features individually and combine them to form further meaningful combinations.

In the drawings.

DETAILED DESCRIPTION

Figure 1:
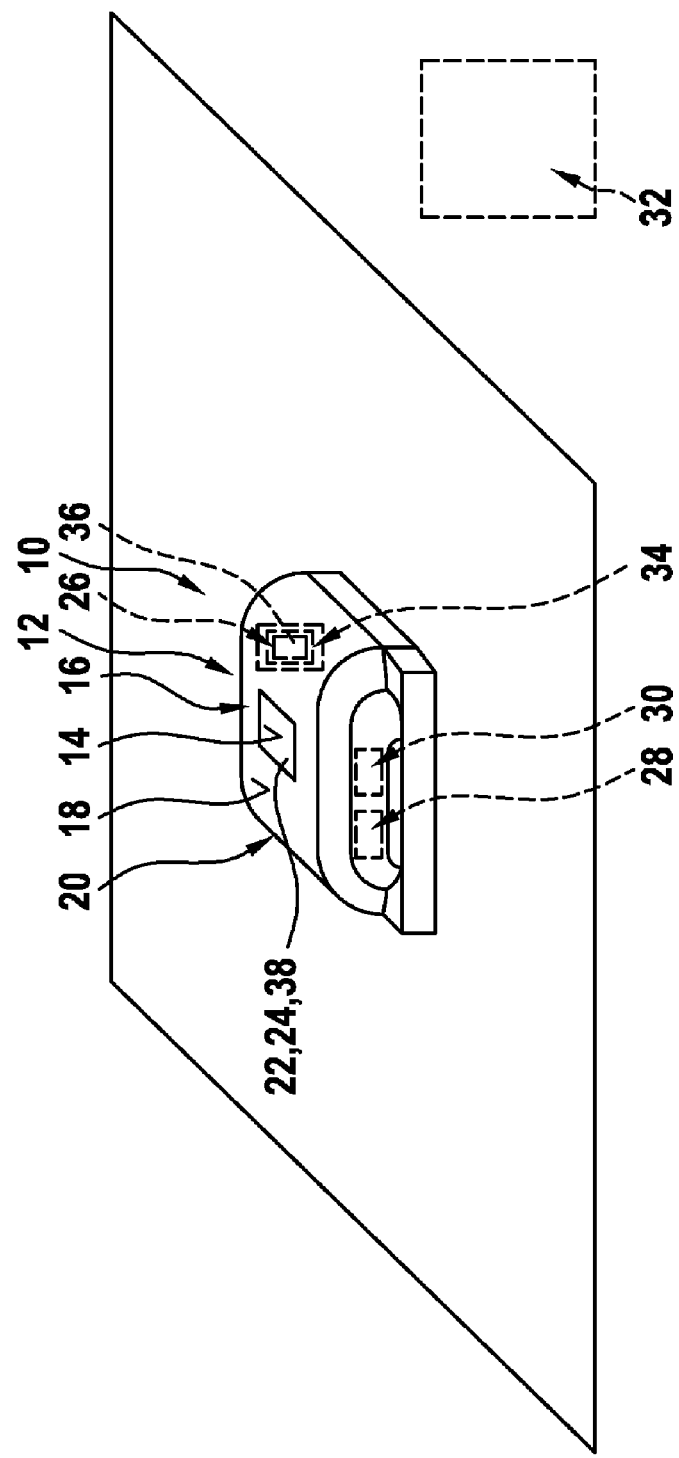
FIG. 1 shows a schematic illustration of a garden appliance according to the disclosure having a rain detection device according to the disclosure.

FIG. 1 shows a garden appliance 10 having a rain detection device 12. The garden appliance 10 is designed as a semi-autonomous lawnmower, in particular a robotic lawnmower. In particular, the garden appliance 10, designed as a lawnmower, has a moveable design. However, other designs of the garden appliance 10 are also conceivable, for example as a stationary appliance, such as a lawn sprinkler, etc. The rain detection device 12 is intended for sensing rain drops on a surface 14. The surface 14 is designed as part of the rain detection device 12, in particular a sensor unit 16 of the rain detection device 12. The surface 14 is arranged in particular on an external surface 18 of a housing 20 of the garden appliance 10. The surface 14 is arranged on an upper side of the garden appliance 10. The rain detection device 12 comprises the sensor unit 16, which comprises exactly one capacitive sensor element 22, the sensor element 22 being designed and/or arranged in such a way that a capacitance characteristic value of the sensor element 22 changes depending on an object, e.g. a rain drop, contacting the surface 14. The capacitance characteristic value is formed as an electrical capacitance of an electrode pair 24 which forms the sensor element 22. The rain detection device 12 comprises an evaluation unit 26, which is configured to detect rain drops on the surface 14 depending on a differential signal from the sensor element 22. In particular, the differential signal is formed as a temporal curve of a rate of change of the capacitance characteristic value of the sensor element 22. The gardening appliance comprises an operator interface 28 for a user interaction. The garden appliance 10 comprises a communication unit 30 for data transfer between the garden appliance 10, in particular the rain detection device 12, and an external unit 32. The external unit 32 is designed as a Smart Home system. However, other designs of the external unit 32 are also conceivable, for example as a network, an internet connection, another garden appliance 10 or the like. In particular, the communication unit 30 is designed as a W-LAN interface. However, other designs of the communication unit 30 are also possible, for example as a Bluetooth interface, as an optical interface, as a wired communication unit or the like. Other designs of the garden appliance 10 and/or the rain detection unit 12 are also possible, for example, wherein the rain detection unit 12, in particular independently of the garden appliance 10, comprises an operator interface 28 and/or a communication unit 30.

In particular, the rain detection device 12, in particular the evaluation unit 26, is designed to detect rain drops incident on the surface 14. The rain detection device 12 is designed as part of the garden appliance 10. The garden appliance 10 comprises a control and/or regulation unit 34 which is configured to control and/or regulate the garden appliance 10, in particular an activity and/or locomotion of the garden appliance 10, semi-autonomously. The evaluation unit 26 is designed as part of the control and/or regulation unit 34 of the semi-autonomous garden appliance 10. However, it is also conceivable, in particular in a non-autonomous embodiment of the garden appliance 10, that the rain detection device 12 comprises an in particular separate control and/or regulation unit 34. Preferably, the semi-autonomous garden appliance 10, in particular the control and/or regulation unit 34, is intended and/or configured to control and/or regulate at least one activity, in particular a mowing process or a locomotion, depending on an output signal from the rain detection device 12.

Preferably, the evaluation unit 26 and the control and/or regulation unit 34 are designed as an electronic unit, in particular as a populated electronic circuit board. It is also conceivable, however, that the evaluation unit 26 is designed separately from the control and/or regulation unit 34, in particular as a populated electronic circuit board. The evaluation unit 26 comprises a microcontroller 36 for evaluating signals acquired via the sensor unit 16, in particular the sensor element 22. The evaluation unit 26, in particular the microcontroller 36, is preferably electrically and/or electronically connected to the sensor unit 16, in particular to the sensor element 22. Preferably, the evaluation unit 26, in particular the microcontroller 36, is designed to detect rain drops on the surface 14 by reading out the signals acquired via the sensor unit 16, in particular the sensor element 22, in particular the capacitance characteristic value and/or the differential signal, at least substantially continuously and in particular by evaluating them. The evaluation unit 26, in particular the microcontroller 36, is particularly preferably configured to generate the differential signal of the sensor element 22 depending on the capacitance characteristic value, in particular transmitted from the sensor element 22 to the evaluation unit 26. The evaluation unit 26 is preferably configured to subtract, in particular continuously, at least one value of the capacitance characteristic value from another previously acquired value of the capacitance characteristic value in order to generate the differential signal, in particular to calculate a value of the differential signal, wherein in particular a value of the differential signal is determined. It is conceivable that the evaluation unit 26 is configured to generate, determine and/or calculate the differential signal, in particular the values of the differential signal, either by circuit technology or electronically, in particular by means of the microcontroller. Alternatively, embodiments of the rain detection device 12 are also conceivable wherein the sensor unit 16 is intended to generate the differential signal and transmit it to the evaluation unit 26.

In particular, the rain detection device 12 comprises exactly one capacitive sensor element 22, which forms in particular at least one electrode pair 24, preferably exactly one. However, other embodiments of the sensor unit 16 are also possible, for example with more than one sensor element 22 and/or with more than one electrode pair 24 of the sensor element 22/sensor elements 22. The surface 14 is spaced apart from the electrode pair 24 of the sensor element 22. In particular, the surface 14 is formed as an external surface of the sensor unit 16, in particular of an insulating element 38 of the sensor unit 16, and/or arranged within close range of the sensor element 22, in particular the electrode pair 24. The electrode pair 24 of the sensor element 22 is designed to be electrically insulated from the surface 14 by means of the insulating element 38. For example, the insulating element 38 is designed as an insulating layer made of an at least substantially electrically insulating material. The evaluation unit 26 is configured to detect a rain drop on the surface 14 depending on a symmetry characteristic value of the differential signal, in particular with respect to a zero point.

Figure 2:
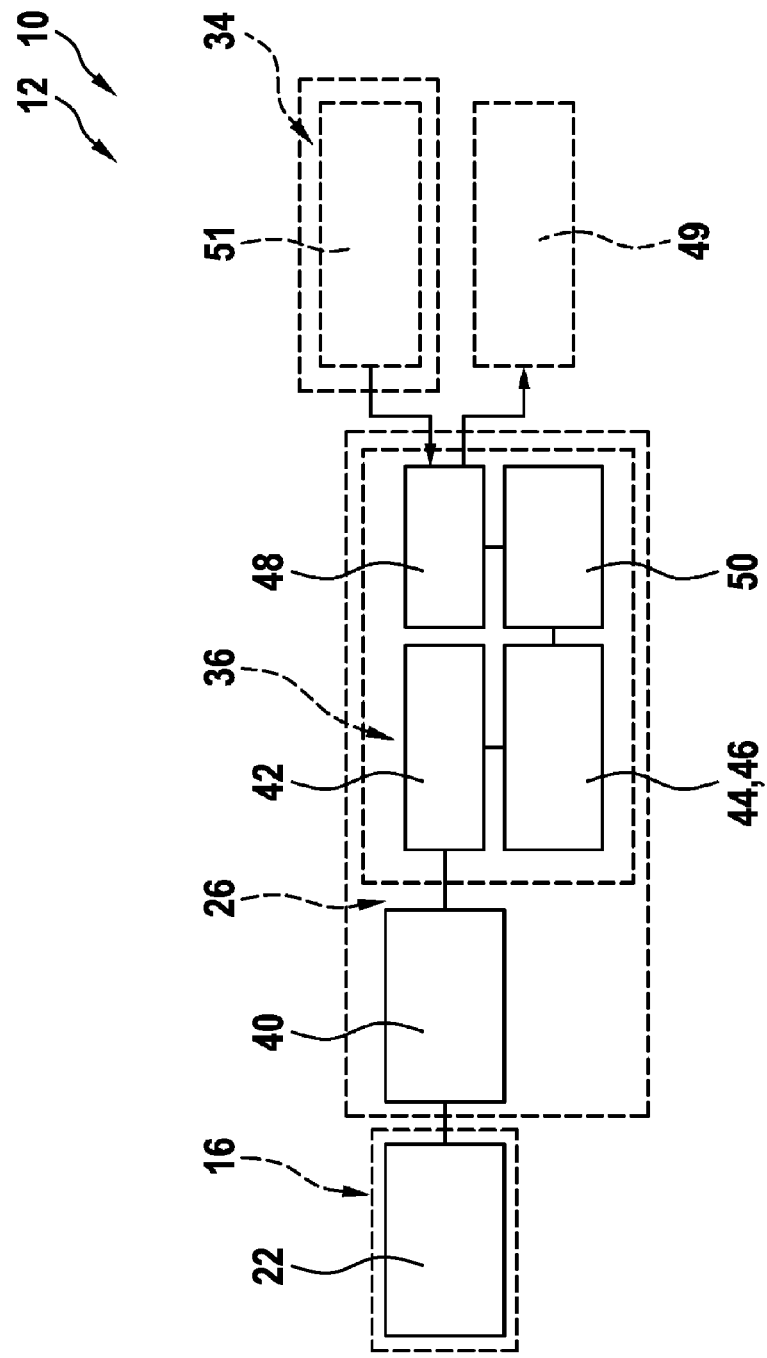
FIG. 2 shows a sketch of the principle of the rain detection device according to the disclosure.

FIG. 2 shows a schematic sketch of the rain detection device 12, showing in particular the signal paths, functions and components of the rain detection device 12. The evaluation unit 26 has a digital converter 40, which is designed to convert the capacitive signals of the sensor element 22, in particular the capacitance characteristic value, into a digital data stream and transmit it to the microcontroller 36. In particular, the digital converter 40 is intended to retrieve the capacitance characteristic value at least substantially continuously, in particular with a readout frequency of at least essentially 38 Hz. The evaluation unit 26, in particular the microcontroller 36, is configured (see function 42) to generate the differential signal from the capacitance characteristic value transferred as a digital data stream. Preferably, the digital converter 40 comprises at least one oscillator circuit (not shown in the figures), wherein the digital converter 40 is designed to convert the capacitance characteristic value into the digital data stream by detecting a resonance frequency of the oscillator circuit. In particular, the resonance frequency of the oscillator circuit depends on the capacitance characteristic value of the sensor element 22. In order to convert the capacitance characteristic value of the sensor element 22 into the digital data stream, the resonance frequency of the oscillator circuit or another characteristic value of the digital converter 40, in particular of the oscillator circuit, proportional to it is measured, which changes in particular when the capacitance characteristic value changes. In particular, a nominal oscillation frequency of the oscillator circuit is at least essentially 6.530 MHz. Other embodiments of the digital converter 40 are also conceivable, however.

The symmetry characteristic value is formed as a ratio of a positive weighting characteristic value of the differential signal and a negative weighting characteristic value of the differential signal (see also FIGS. 7 and 8), wherein the evaluation unit 26 is configured to detect a rain drop on the surface 14 depending on a limit value or a limit range of the symmetry characteristic value being exceeded. Preferably, the positive weighting characteristic value is formed as an, in particular absolute, maximum of the differential signal within an evaluated time interval, as a positive component of an integral of the differential signal over the evaluated time interval, or as a sum of local maxima within the evaluated time interval. Preferably, the negative weighting characteristic value is formed as an, in particular absolute, minimum of the differential signal within the evaluated time interval, as a negative component of an integral of the differential signal over the evaluated time interval, or as a sum of local minima within the evaluated time interval. The evaluation unit 26 comprises an algorithm 44 for detecting rain drops on the surface 14 and/or for detecting a rain condition on the surface 14 by means of signals acquired via the sensor element 22. In particular, the rain condition describes whether it is raining or not depending on a specified limit for a number of rain drops detected on the surface 14 by the evaluation unit 26 within a specified period of time. The evaluation unit 26, in particular the algorithm 44, is configured to detect rain drops on the surface 14 by comparing the ratio of the positive weighting characteristic value of the differential signal and the negative weighting characteristic value of the differential signal with the at least one limit value or the limit range of the symmetry characteristic value. In particular, the limit value or the limit range of the symmetry characteristic value is stored in the evaluation unit 26. It is conceivable that the limit value or the limit range of the symmetry characteristic value can be specified during production or maintenance of the rain detection device 12 and/or dynamically adapted by means of the evaluation unit 26, in particular the algorithm 44, for example by means of a machine learning procedure. It is also possible for the limit value or the limit range of the symmetry characteristic value to be adjustable by a user via an operator interface 28. In a preferred embodiment, the limit value of the symmetry characteristic value formed as a ratio of the positive weighting characteristic value and the negative weighting characteristic value is at least 2, preferably at least 3 and preferably at least 4, wherein in particular the evaluated time interval is at least 2 s, preferably at least 3 s, and preferably at least 4 s and/or not more than 10 s, preferably not more than 8 s, and most preferably not more than 5 s. Alternatively or in addition, the evaluation unit 26 is designed to detect a rain condition on detecting at least 2, preferably at least 3 and most preferably at least 4 rain drops on the surface 14 within a time interval of at least 2 s, preferably at least 3 s and most preferably at least 4 seconds and/or not more than 10 seconds, preferably not more than 8 s and most preferably not more than 5 s.

The evaluation unit 26, in particular the algorithm 44, is configured (see function 46) to evaluate the differential signal piecewise at time intervals, in particular continuously, and to output exactly one Boolean value of a rain condition on the surface 14 for each time interval evaluated. In particular, a Boolean value of the rain state indicates a rain condition on the surface 14, while another Boolean value of the rain condition indicates an absence of the rain condition on the surface 14. The time intervals are preferably in each case at least 2 s, preferably at least 3 s and preferably at least 4 s and/or not more than 10 s, preferably not more than 8 s and most preferably not more than 5 s. The time intervals are preferably arranged consecutively, with the evaluation unit 26 in particular being configured to divide the continuous differential signal into the time intervals. Alternatively, it is also conceivable that the evaluation unit 26 is designed to evaluate the differential signal at periodic intervals over a time interval.

The evaluation unit 26 is configured (see function 48) to output at least one output signal 49, in particular the Boolean value of the rain condition on the surface 14, depending on the detection of rain drops on the surface 14, the evaluation unit 26 being configured (see function 50) to temporally limit the output signal 49 and/or a change in the output signal 49. The evaluation unit 26 is preferably configured (see function 50) to limit a number of output values, in particular the Boolean values, of the rain condition and/or temporally limit the number of output operations of the rain condition. The evaluation unit 26 is preferably configured to store an output value, in particular a Boolean value, of the rain condition at least over a time interval, and to output a further rain condition value only after this time interval has elapsed, the time interval being at least 2 s, preferably at least 3 s, and preferably at least 4 s and/or not more than 1 minute, preferably not more than 30 s and most preferably not more than 10 s. Preferably, the output signal 49 comprises at least the Boolean value determined by the evaluation unit 26. The evaluation unit 26 is configured to output the output signal 49 to the garden appliance 10 and/or the external unit 32. In particular, the communication unit 30 is intended to transmit the output signal 49 to the external unit 32. The evaluation unit 26 is configured to determine a number of detected and/or identified rain drops for each evaluated time interval. In particular, the evaluation unit 26 is configured to detect the rain condition on the surface 14 when a limit of the number of rain drops detected and/or identified within the time interval is exceeded. The evaluation unit 26 is preferably configured to output an output signal 49 comprising the Boolean value of the rain condition when the rain condition is detected on the surface 14.

The control and/or regulation unit 34, in particular alternatively a control and/or regulation unit of the rain detection device 12, is configured to adapt at least one evaluation parameter of the evaluation unit 26, in particular of the microcontroller 36 and/or algorithm 44, depending on a sensitivity characteristic value 51 which has been automatically determined and/or specified, in particular via the evaluation unit 26. In particular, the control unit 34 is configured to transfer the sensitivity characteristic value 51 to the evaluation unit 26, wherein the evaluation unit 26, in particular the microcontroller 36, is configured to adjust the evaluation parameter according to a value of the evaluation parameter assigned to a transferred value of the sensitivity characteristic value 51. It is also possible that the sensitivity characteristic value 51 is transmitted directly via the operator interface 28 or an operator interface of the rain detection device 12 to the evaluation unit 26, in particular the microcontroller 36.

Figure 3:
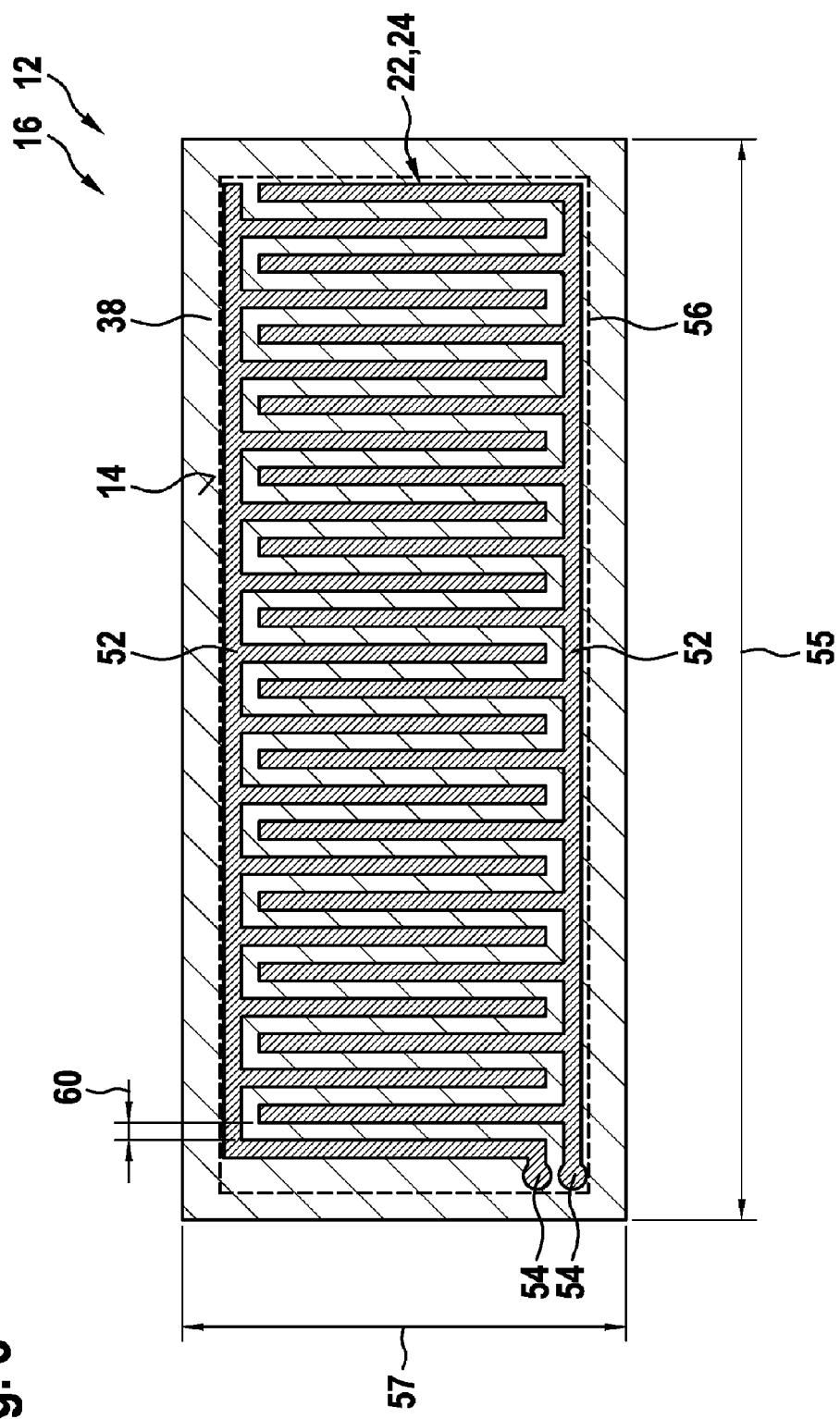
FIG. 3 shows a schematic cross-sectional view of a sensor unit of the rain detection device according to the disclosure as a plan view.

FIG. 3 shows a schematic, sectional plan view of the sensor unit 16, wherein in particular the sensor unit 16 is cut through the sensor element 22 along a main extension plane of the sensor element 22. The sensor unit 16 is designed as an in particular at least substantially non-rigid, flexible membrane which is at least electrically connected to the evaluation unit 26. The sensor unit 16 comprises two, in particular plate-shaped, flexible insulating elements 38, wherein in particular the electrode pair 24 is arranged between the two insulating elements 38. The insulating elements 38 are made of an in particular at least substantially non-rigid, flexible material, such as a plastic, rubber, or similar. The electrode pair 24 is arranged at least for the most part, in particular at least essentially completely, within the two insulating elements 38, for example cast in and/or embedded. The sensor element 22 is designed in such a way that a change of a minimum distance between two electrodes 52 of the electrode pair 24 is at least substantially prevented in the event of deformation, in particular bending, of the sensor element 22 and/or of the insulating element 38. In particular, the electrode pair 24 is applied to an insulating element 38 of the two insulating elements 38 by means of screen printing, wherein the electrode pair 24 in particular is arranged between the insulating element 38 and the other insulating element 38 of the two insulating elements 38. In particular, to form a connection to the evaluation unit 26, the electrode pair 24 with the exception of two electrical contacts 54 of the electrode pair 24 is at least substantially completely enclosed by the insulating element 38 and the further insulating element 38. The sensor element 22, in particular the electrode pair 24, and the insulating elements 38 are formed in one piece. However, it is also possible to design the sensor unit 16 with only one insulating element 38, which forms the surface 14 and/or is arranged between the surface 14 and the electrode pair 24. In particular, the electrode pair 24 is arranged on the insulating element 38 on a side of the insulating element 38 facing away from the surface 14.

The capacitive sensor element 22 forms exactly one electrode pair 24 which is at least electrically connected to the evaluation unit 26, wherein the electrode pair 24 covers a maximum sensing area 56 which is at least 12 $cm^2$, preferably at least 16 $cm^2$ and most preferably at least 20 $cm^2$. In particular, the maximum sensing area 56 of the sensor element 22, shown in particular in FIG. 3, in particular of the electrode pair 24, is at least essentially 16.12 $cm^2$. In particular, the maximum sensing area 56 of the sensor element 22, in particular the electrode pair 24, is not more than 100 $cm^2$, preferably not more than 50 $cm^2$ and most preferably not more than 30 $cm^2$. The surface 14 of the sensor unit 16, in particular of the insulating element 38, corresponds at least to the maximum sensing area 56 of the sensor element 22, in particular the electrode pair 24. The maximum sensing area 56 of the sensor element 22, in particular of the electrode pair 24, is arranged at least substantially parallel to the surface 14. The maximum sensing area 56 of the sensor element 22, in particular the electrode pair 24, is formed in particular as a surface that just completely surrounds the electrode pair 24. In particular, a minimum distance 58 between the two electrodes 52 of the electrode pair 24 is arranged within the maximum sensing area 56 of the sensor element 22, in particular the electrode pair 24. Preferably, in the initial state of the sensor element 22, in particular in the absence of a solid object and/or rain drops on the surface 14 and/or with only air within close range of the surface 14, the sensor element 22, in particular the electrode pair 24, has a capacitance characteristic value of at least 5 pF, preferably at least 10 pF and most preferably at least 12 pF. Preferably, the capacitance characteristic value of the sensor element 22, in particular of the electrode pair 24, in the initial state corresponds to a value of at least essentially 12.8 pF. In particular, the capacitance characteristic value of the sensor element 22, in particular of the electrode pair 24, in the initial state is not more than 50 pF, preferably not more than 30 pF, and most preferably not more than 20 pF. In particular, the sensor unit 16, in particular the sensor element 22 and/or the insulating element 38, is designed in such a way that a value of the capacitance characteristic value of the sensor element 22 changes by a value from a value range from 100 fF to 1000 fF, preferably from 200 fF to 800 fF and most preferably from 300 fF to 500 fF, when a rain drop is incident on the surface 14.

The two electrodes 52 of the electrode pair 24 are formed at a distance apart from each other. The minimum distance 60 between the two electrodes 52 is not more than 1.5 mm, preferably not more than 1.2 mm, and most preferably not more than 1 mm. In particular, the minimum distance 60 between the two electrodes 52, shown in particular in FIG. 3, is at least essentially 1 mm. In particular, the minimum distance 60 between the two electrodes 52 is at least 0.2 mm, preferably at least 0.4 mm and most preferably at least 0.5 mm. In particular, the two electrodes 52 extend in the main extension plane of the sensor element 22, which is oriented at least substantially parallel to the surface 14. In particular, the main extension plane of the sensor element 22 in FIG. 3 is arranged at least substantially parallel to the image plane and in particular is not shown in the figures. The surface 14 has a flat surface and is arranged at least substantially parallel to the main extension plane of the sensor element 22. It is also conceivable, however, that the surface 14 and/or the sensor element 22, in particular the two electrodes 52 and/or the two insulating elements 38, may be bent, wherein in particular the surface 14 and the sensor element 22, in particular the two electrodes 52, have an at least essentially identical basic shape, in particular a bend. The maximum thickness of the sensor element 22, in particular of the two electrodes 52, is preferably oriented at least substantially perpendicular to the main extension plane 22 of the sensor element. The sensor element 22, in particular the two electrodes 52, is at least substantially plate-shaped in an unloaded state. However, it is also conceivable that the sensor element 22, in particular the two electrodes 52, may have a circular-segment shaped and/or curved basic shape in at least one cutting plane, oriented in particular at least substantially perpendicular to the main extension plane of the sensor element 22.

The sensor unit 16, in particular the sensor element 22 and the insulating elements 38, have a rectangular basic shape. However, other designs of the sensor unit 16 are also conceivable, for example with a round or square basic shape. Preferably, the sensor unit 16, in particular the sensor element 22 and/or the insulation elements 38, has a maximum longitudinal extension 55 of at least 4 cm, preferably at least 5 cm, and most preferably at least 6 cm. In particular, the maximum longitudinal extension 55 of the sensor unit 16, in particular of the sensor element 22 and/or the insulating elements 38 shown in FIG. 3, is at least essentially 6.2 cm. Preferably, the sensor unit 16, in particular the sensor element 22 and/or the insulation elements 38, has a maximum transverse extension 57 of at least 1.5 cm, preferably at least 2 cm, and most preferably at least 2.5 cm. In particular, the maximum transverse extension 57 of the sensor unit 16, in particular of the sensor element 22 and/or the insulating elements 38 shown in FIG. 3, is at least essentially 2.6 cm. In particular, the maximum longitudinal extension 55 and the maximum transverse extension 57 of the sensor unit 16, in particular of the sensor element 22 and/or the insulating elements 38, are arranged at least substantially perpendicular to each other. The maximum longitudinal extension 55 of the sensor unit 16, in particular of the sensor element 22 and/or the insulating elements 38, is preferably designed as the longest edge of an imaginary block which just completely encloses the sensor unit 16, in particular the sensor element 22 and/or the insulating elements 38. In particular, the maximum longitudinal extension 55 and/or the maximum transverse extension 57 of the sensor unit 16, in particular of the sensor element 22 and/or the insulation elements 38, viewed in the main extension plane of the sensor unit 16, are designed as side edges of the imaginary block which just completely encloses the sensor unit 16, in particular the sensor element 22 and/or the insulation elements 38.

Figure 4:
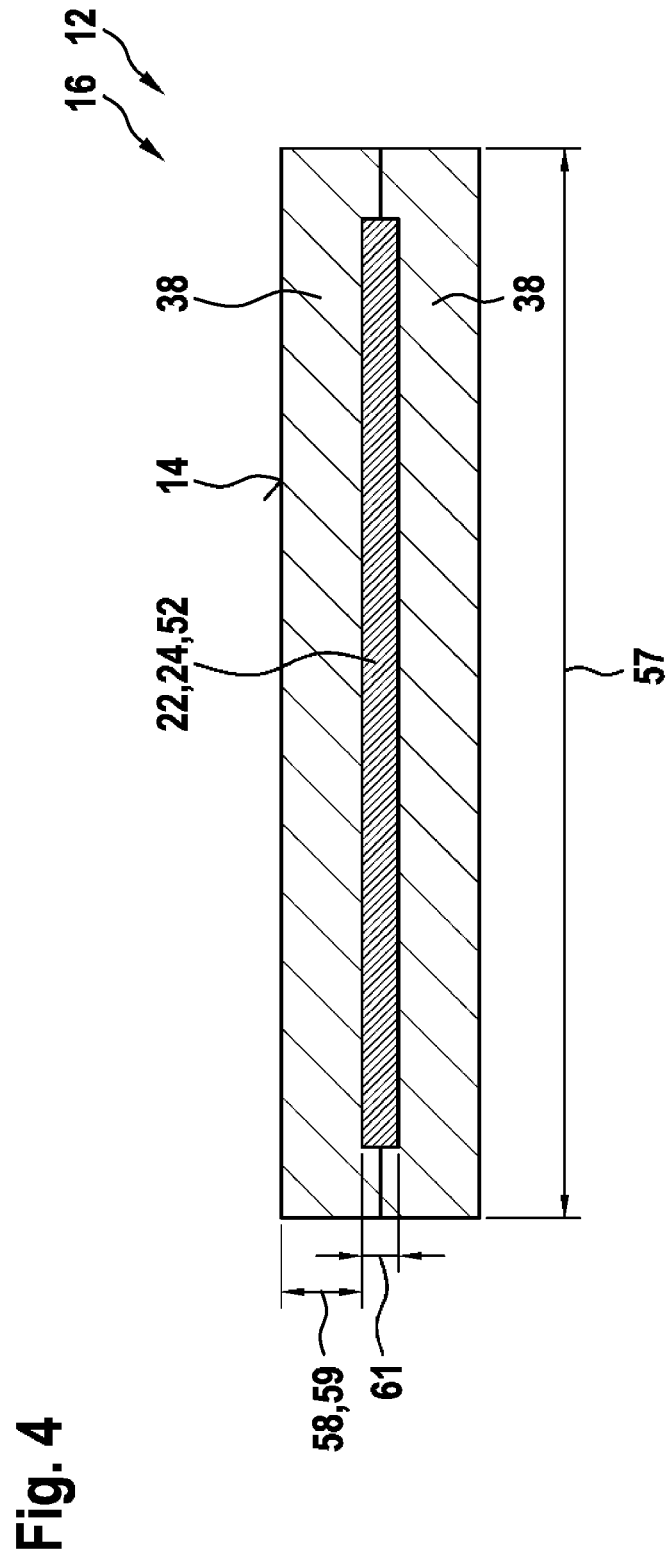
FIG. 4 shows a schematic cross-sectional view of the sensor unit of the rain detection device according to the disclosure as a side view.

FIG. 4 shows a schematic, sectional side view of the sensor unit 16, wherein in particular the sensor unit 16 is cut essentially perpendicular to the main extension plane of the sensor element 22 of the sensor element 22. In particular, the minimum distance 58 between the surface 14 and the two electrodes 52 is not more than 0.8 mm, preferably not more than 0.5 mm, and most preferably not more than 0.38 mm. In particular, the minimum distance 58 between the surface 14 and the two electrodes 52 is at least essentially 0.35 mm. In particular, the minimum distance 58 between the surface and the two electrodes 52 corresponds essentially to a thickness 59 of one of the two insulating elements 38, which is arranged in particular between the two electrodes 52 and the surface 14. In particular, the minimum distance 58 between the surface 14 and the two electrodes 52 is at least 0.05 mm, preferably at least 0.15 mm, and most preferably at least 0.3 mm. The minimum distance 58 between the surface 14 and the two electrodes 52 over a region that extends between the surface 14 and the two electrodes 52 is preferably at least substantially constant. Preferably, the sensor unit 16 is designed in such a way that an object, in particular a rain drop, which is moving or arranged within close range of the surface 14 and/or touches the surface 14, influences and/or changes a value of the capacitance characteristic value of the sensor element 22, in particular of the electrode pair 24. The sensor element 22, in particular the two electrodes 52, have a maximum thickness 61 of not more than 3 mm, preferably not more than 2.5 mm and preferably not more than 2 mm, wherein in particular the maximum thickness 61 of the sensor element 22, in particular the two electrodes 52, is oriented at least substantially perpendicular to the main extension plane of the sensor element 22 and/or to the maximum sensing area 56 of the sensor element 22, in particular the electrode pair 24.

Figure 5:
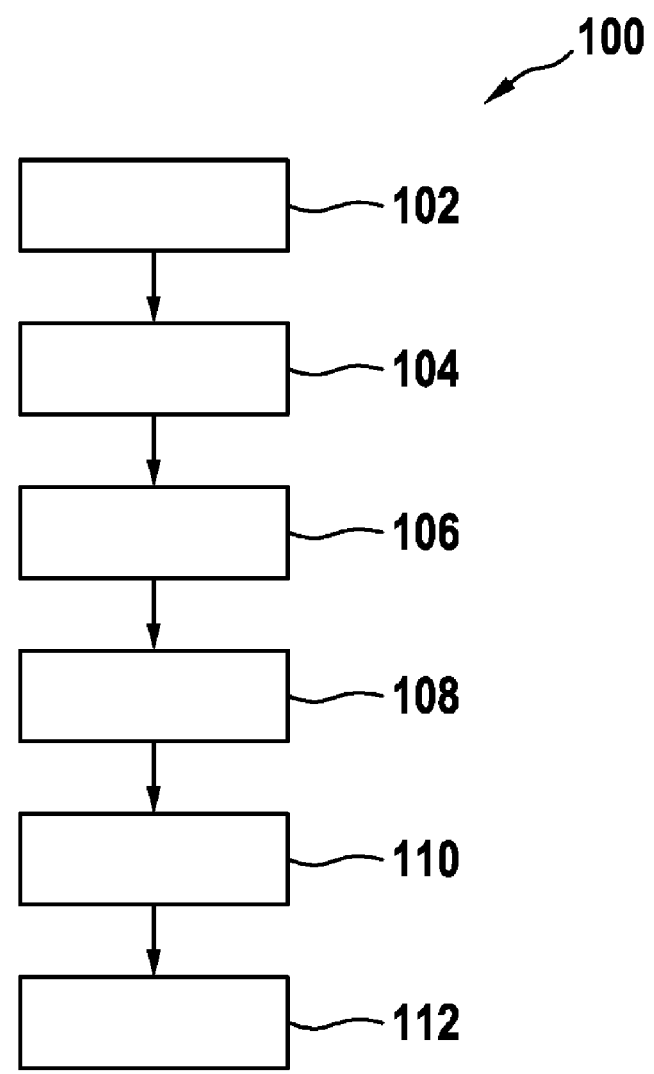
FIG. 5 shows a schematic illustration of a sequence of a method according to the disclosure for detecting rain drops on a surface by means of the rain detection device according to the invention disclosure.

FIG. 5 shows an example sequence of a method 100 for sensing rain drops on the surface 14 by means of the rain detection device 12. In a method step 102 of the method 100, the capacitance characteristic value is sensed using the capacitive sensor element 22 of the rain detection device 12. In a further method step 104 of the method 100, the differential signal is generated from the acquired capacitance characteristic value by means of the evaluation unit 26. In a further method step 106 of the method 100, in particular before an evaluation to detect rain drops on the surface 14, the differential signal is filtered for interference signals by means of the evaluation unit 26. Alternatively, it is also conceivable that the capacitance characteristic can be filtered for interfering signals by means of the evaluation unit 26, preferably before the differential signal is generated. In a further method step 108 of the method 100, rain drops are detected on the surface 14 by means of the evaluation unit 26 of the rain detection device 12 depending on the differential signal of the sensor element 22. In one method step of the method 100, in particular method step 108, rain drops on the surface 14 are detected by means of the evaluation unit 26 depending on the symmetry characteristic value of the differential signal, in particular with respect to a zero point. Preferably, in a method step of the method 100, in particular method step 108, the algorithm 44 is executed by means of the evaluation unit 26 to detect rain drops on the surface 14 and/or the rain condition on the surface 14. In one method step of the method 100, in particular method step 108, the continuous differential signal is evaluated by means of the evaluation unit 26 for detecting rain drops on the surface 14 depending on at least one weighting characteristic value of the differential signal over a predefined or a dynamic time interval. In at least one further method step 110 of the method 100, the evaluation unit 26 outputs exactly one Boolean value of a rain condition on the surface 14 for each evaluated time interval. In particular, the evaluation unit 26 is used to determine a number of detected and/or identified rain drops for each evaluated time interval. Preferably, the evaluation unit 26 detects the rain condition on the surface 14 when the limit of the number of rain drops detected and/or identified within the time interval is exceeded. The evaluation unit 26 is preferably configured to output an output signal comprising the Boolean value of the rain condition when the rain condition is detected on the surface 14. In particular, the output of the output signal and/or a change in the output signal is temporally limited by means of the evaluation unit 26. In a further method step 112 of the method 100, the control and/or regulation unit 34 is used to adjust at least one evaluation parameter of the evaluation unit 26 depending on a sensitivity characteristic value automatically determined and/or predefined, in particular via the evaluation unit 26. In particular, the sensitivity characteristic value is transmitted to the evaluation unit 26 by a user or the external unit 32, for example, by means of the operator interface 28 and/or the communication unit 30.

Figure 6:
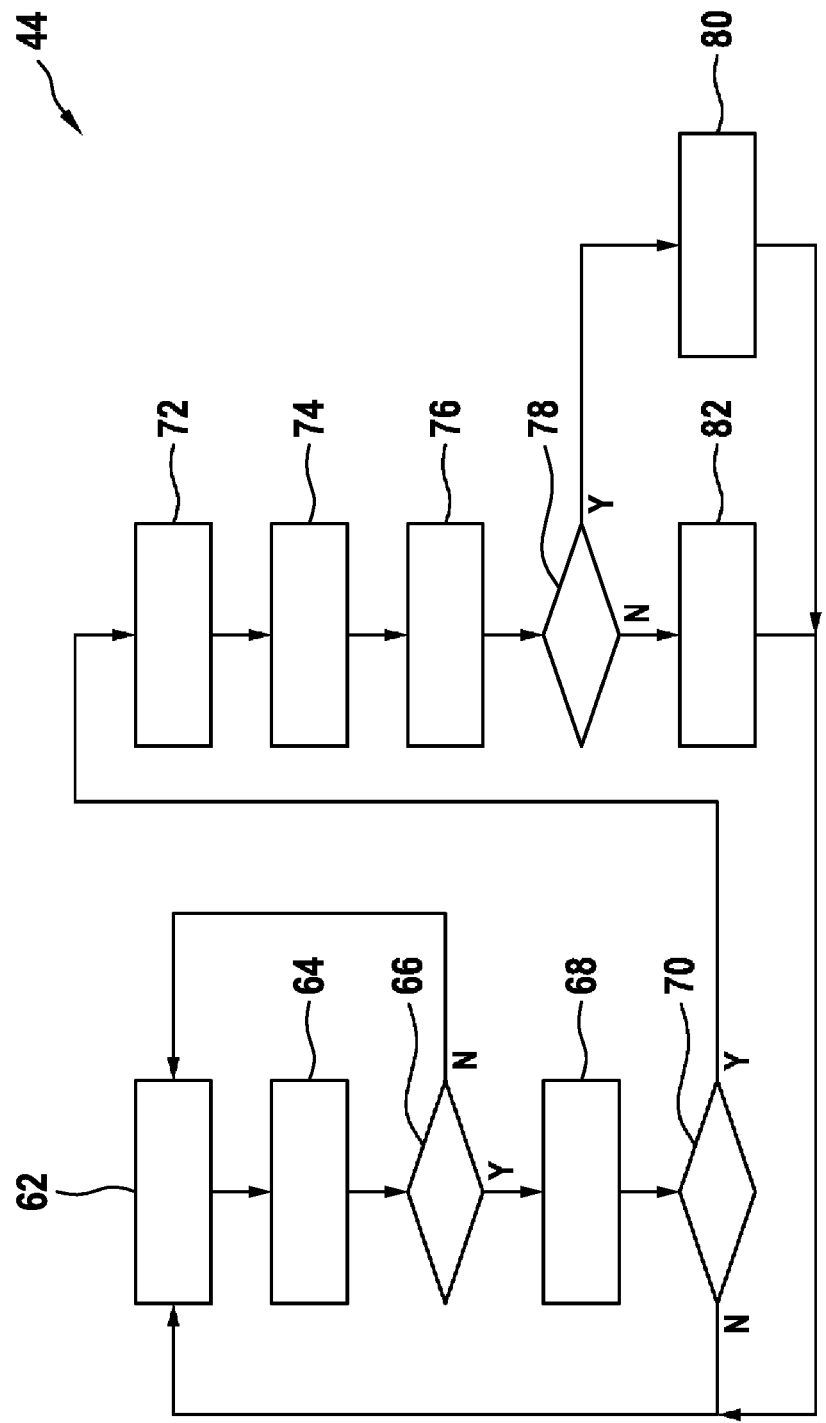
FIG. 6 shows a schematic illustration of a sequence of an algorithm of the rain detection device according to the disclosure, which can be carried out by means of an evaluation unit of the rain detection device.

FIG. 6 shows a schematic sequence of the algorithm 44 of the evaluation unit 26, in particular of the microcontroller 36. In particular, the algorithm 44 can be executed by means of the evaluation unit 26, in particular the microcontroller 36. Preferably all steps 62, 64, 66, 68, 70, 72, 74, 76, 78, 80, 82 of the algorithm 44, in particular according to the sequence of the algorithm 44 shown in FIG. 6 and described below, are executed by means of the evaluation unit 26, in particular the microcontroller 36. In a first step 62 of the algorithm 44, values of the capacitance characteristic value are read in from the sensor unit 16. In a further step 64 of the method 44, the differential signal is generated from the read values of the capacitance characteristic value. In a further step 66 of the algorithm 44, it is determined whether a signal peak has already been detected within a monitored and/or evaluated time interval. If this is not the case, additional values of the capacitance characteristic value are read in. If a signal peak has already been detected, in a further step 68 of the algorithm 44 the signal peak is stored and evaluated with respect to a maximum and/or an integral of the signal peak, wherein in particular the maximum and/or the integral of the signal peak is/are stored. In a further step 70 of the algorithm 44, it is checked whether an end of a current time interval for detecting rain drops has been reached. If this is not the case, additional values of the capacitance characteristic value are read in. When the end of the current time interval is reached, the negative weighting characteristic of the differential signal for the time interval is determined in a further step 72 of the algorithm 44, wherein in particular all negative signal peaks, in particular the maxima and/or the integrals of the negative signal peak, are summed. In a further step 74 of the algorithm 44, the positive weighting characteristic value of the differential signal for the time interval is determined, wherein in particular all positive signal peaks, in particular the maxima and/or the integrals of the positive signal peaks, are summed. In a further step 76 of the algorithm 44, the ratio of the positive weighting characteristic value and the negative weighting characteristic value for the time interval is calculated. In a further step 78 of the algorithm 44, the calculated ratio of the positive weighting characteristic and the negative weighting characteristic value for the time interval is compared with the limit value or the limit range of the symmetry characteristic value. If the calculated ratio of the positive weighting characteristic value and the negative weighting characteristic value for the time interval exceeds the limit value or the limit range of the symmetry characteristic value, an output signal formed as a Boolean value is output in a further step 80 of the algorithm, wherein in particular the Boolean value indicates a rain condition on the surface 14. If the calculated ratio of the positive weighting characteristic value and the negative weighting characteristic value for the time interval does not exceed the limit value or the limit range of the symmetry characteristic value, an output signal formed as another Boolean value is output in a further step 82 of the algorithm 44, wherein in particular, the other Boolean value indicates absence of the rain condition on the surface 14. After the output signal has been output, a process of reading in values of the capacitance characteristic value of a further time interval, in particular following the time interval, is started (see first step 62 of the algorithm 44).

Figure 7:
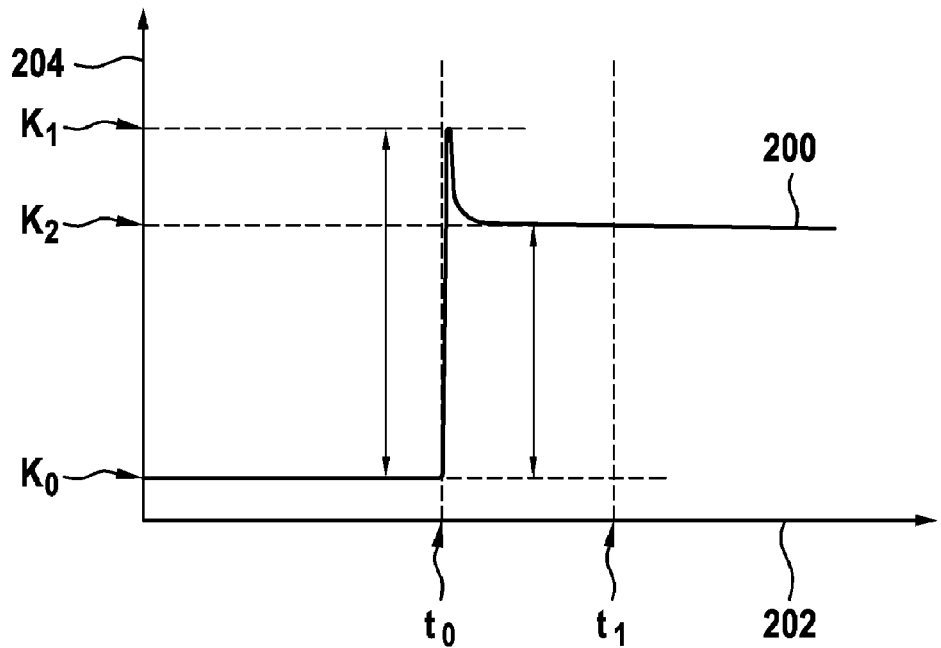
FIG. 7 shows an example measurement of a time curve of a capacitance characteristic value of the sensor element in the event of a rain drop impinging on the surface and FIG. 8 shows an example measurement of a time curve of a differential signal of the sensor element during a rain condition.

FIG. 7 shows an example measurement of a temporal curve 200 of the capacitance characteristic value of the sensor element 22 when a rain drop is incident on the surface 14. An abscissa 202 represents the time. An ordinate 204 represents the capacitance characteristic value as a function of time. When the rain drop is incident at time $t_0$, the capacitance characteristic value of the sensor element 22 is increased abruptly from a base value $k_0$ to a value $k_1$. The capacitance characteristic value then falls back to a value $k_2$ until a time $t_1$, wherein in particular the value $k_2$ is greater than the base value $k_0$. The value $k_2$ of the capacitance characteristic value, which has increased in particular compared to the base value $k_0$, is preferably generated by a quantity of water of the rain drop distributed over the surface 14. A differential signal generated from the time curve 200 of the capacitance characteristic value, shown in particular in FIG. 7, has a positive signal peak and a negative signal peak (see FIG. 8), wherein in particular a magnitude of a maximum of the positive signal peak is greater than a magnitude of a minimum of the negative signal peak. In particular, a value of an integral over the positive signal peak is greater than a value of an integral over the negative signal peak. Preferably, a time curve 206 of the differential signal generated from the time curve 200 of the capacitance characteristic value, shown in particular in FIG. 7, shows an asymmetry with respect to the zero point (see FIG. 8). In particular, the evaluation unit 26 is configured to detect and/or identify a rain drop on the surface 14 during an evaluation of the time curve 206 of the differential signal generated from the time curve 200 of the capacitance characteristic value, shown in particular in FIG. 7.

Figure 8:
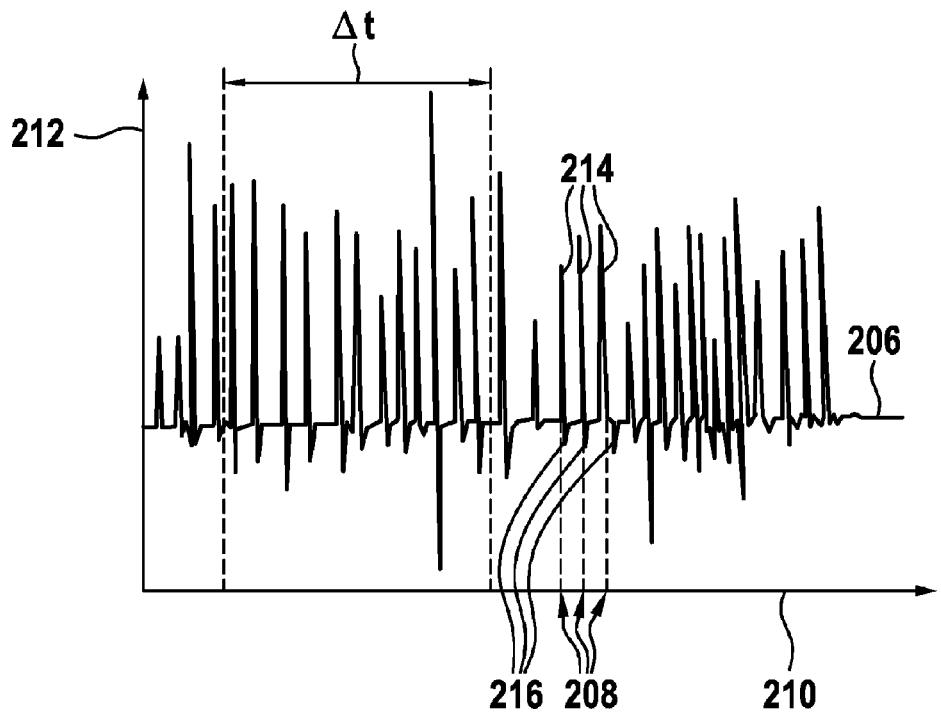

FIG. 8 shows an example measurement of a time curve 206 of the differential signal of the sensor element 22 over a time interval, wherein a plurality of rain drops has struck the surface 14 within the time interval. In particular, an incidence of the rain drops at times 208 can be seen in the time curve 206 of the differential signal. An abscissa 210 represents the time. An ordinate 212 represents the differential signal as a function of time. The time curve 206 of the differential signal comprises a plurality of positive signal peaks 214 and a plurality of negative signal peaks 216, each arranged consecutively in pairs. In particular, the number of the positive signal peaks 214 and the number of the negative signal peaks 216 corresponds to a number of rain drops incident on the surface during the time interval. In each case, a positive signal peak 214 and a negative signal peak 216, which directly follows the positive signal peak 214 and is in particular smaller than the positive signal peak 214, is generated by a rain drop that is incident on the surface 14, in particular by a time curve of the capacitance characteristic value that is similar to the time curve 200 shown in FIG. 7. For example, if more than five rain drops are identified and/or detected by the evaluation unit 26 within a time interval Δt, a rain condition is detected on the surface 14. However, another limit value, in particular different from five, is also conceivable for the recognition and/or identification of the rain condition on the surface 14. In particular, an object that is different from a rain drop, for example a finger or a branch, would generate a positive signal peak and a negative signal peak in the differential signal, but these have a maximum or minimum of at least substantially the same magnitude, or at least substantially identical values when integrated over the signal peaks. Preferably, the evaluation unit 26 is configured to distinguish between rain drops on the surface 14 and objects other than a rain drop that touch the surface 14 and/or are arranged on the surface 14, by means of the symmetry characteristic value.

The invention claimed is:

1. A rain detection device for sensing rain drops on a surface, comprising:
   at least one sensor unit including at least one capacitive sensor element, the at least one capacitive sensor element configured such that a capacitance characteristic value of the at least one capacitive sensor element changes depending on an object contacting the surface; and
   at least one evaluation unit configured to detect rain drops on the surface depending on a differential signal from the at least one capacitive sensor element, the at least one evaluation unit configured to detect a rain drop on the surface depending on a symmetry characteristic value of the differential signal,
   wherein the symmetry characteristic value is formed as a ratio of a positive weighting characteristic value of the differential signal and a negative weighting characteristic value of the differential signal, and
   wherein the at least one evaluation unit is configured to detect the rain drop on the surface depending on a limit value or a limit range of the symmetry characteristic value being exceeded.

2. The rain detection device as claimed in claim 1, wherein the at least one evaluation unit is configured to evaluate the differential signal piecewise at time intervals, and to output exactly one Boolean value of a rain condition on the surface for each time interval evaluated.

3. The rain detection device as claimed in claim 1, wherein:
   the at least one evaluation unit is configured to output at least one output signal depending on the detection of the rain drop on the surface, and
   the at least one evaluation unit is configured to temporally limit the output signal and/or a change in the output signal.

4. The rain detection device as claimed in claim 1, wherein:
   the at least one capacitive sensor element forms at least one electrode pair which is at least electrically connected to the at least one evaluation unit, and
   the electrode pair covers a maximum sensing area of at least 12 cm².

5. The rain detection device as claimed in claim 1, wherein the at least one sensor unit is configured at least partially as a non-rigid, flexible membrane which is at least electrically connected to the at least one evaluation unit.

6. A garden appliance, comprising:
   at least one rain detection device including (i) at least one sensor unit including at least one capacitive sensor element, the at least one capacitive sensor element configured such that a capacitance characteristic value of the at least one capacitive sensor element changes depending on an object contacting the surface, and (ii) at least one evaluation unit configured to detect rain drops on the surface depending on a differential signal from the at least one capacitive sensor element, the at least one evaluation unit configured to detect a rain drop on the surface depending on a symmetry characteristic value of the differential signal,
   wherein the symmetry characteristic value is formed as a ratio of a positive weighting characteristic value of the differential signal and a negative weighting characteristic value of the differential signal, and
   wherein the at least one evaluation unit is configured to detect the rain drop on the surface depending on a limit value or a limit range of the symmetry characteristic value being exceeded.

7. A method for sensing rain drops on a surface using a rain detection device, comprising:
   sensing a capacitance characteristic value using at least one capacitive sensor element of at least one sensor unit of the rain detection device; and
   detecting a rain drop on the surface depending on a symmetry characteristic value of a differential signal of the at least one capacitive sensor element using at least one evaluation unit of the rain detection device,
   wherein the symmetry characteristic value is formed as a ratio of a positive weighting characteristic value of the differential signal and a negative weighting characteristic value of the differential signal, and wherein the at least one evaluation unit is configured to detect the rain drop on the surface depending on a limit value or a limit range of the symmetry characteristic value being exceeded.

8. The method as claimed in claim 7, further comprising: evaluating the differential signal using the at least one evaluation unit to detect rain drops on the surface depending on the positive weighting characteristic value of the differential signal and the negative weighting characteristic value of the differential signal over a predefined or a dynamic time interval.

9. The method as claimed in claim 7, wherein before an evaluation for detecting the rain drop on the surface, the differential signal is filtered for interference signals using the at least one evaluation unit.

10. The method as claimed in claim 7, further comprising: adjusting, using a control and/or regulation unit of the rain detection device, at least one evaluation parameter of the at least one evaluation unit depending on a sensitivity characteristic value automatically determined and/or predefined via the at least one evaluation unit.

11. The method as claimed in claim 7, wherein the symmetry characteristic value of the differential signal is a zero point.

12. The rain detection device as claimed in claim 1, wherein the symmetry characteristic value of the differential signal is a zero point.

* * * * *